(12) United States Patent
Pando Rodriguez et al.

(10) Patent No.: US 10,701,795 B2
(45) Date of Patent: Jun. 30, 2020

(54) DIRECT CURRENT LINK BUS FOR A POWER CONVERTER AND METHOD OF FORMING A DIRECT CURRENT LINK BUS

(71) Applicant: GE AVIATION SYSTEMS LLC, Grand Rapids, MI (US)

(72) Inventors: Luis Javier Pando Rodriguez, Querétaro (MX); Jorge Alberto Acosta Flores, Querétaro (MX); José Israel Zaragoza Hernández, Querétaro (MX); Jorge Alberto Martinez Vargas, Querétaro (MX)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 16/128,055

(22) Filed: Sep. 11, 2018

(65) Prior Publication Data

US 2020/0084878 A1  Mar. 12, 2020

(51) Int. Cl.
*H05K 1/02* (2006.01)
*H05K 1/18* (2006.01)
(Continued)

(52) U.S. Cl.
CPC .......... *H05K 1/0216* (2013.01); *H05K 1/181* (2013.01); *H05K 3/4644* (2013.01); *H02M 5/44* (2013.01);
(Continued)

(58) Field of Classification Search
CPC ... H01G 4/38; H01G 4/40; H05K 1/11; H05K 1/02; H05K 3/30; H05K 3/46; H02G 5/00; H02G 5/007; G02B 26/00
(Continued)

(56) References Cited

U.S. PATENT DOCUMENTS

| 875,494 A | 12/1907 | Bedell |
| 4,346,257 A | 8/1982 | Moss et al. |

(Continued)

FOREIGN PATENT DOCUMENTS

| EP | 3300462 A1 | 3/2018 |
| EP | 33164681 A1 | 5/2018 |
| KR | 20160101289 A | 8/2016 |

OTHER PUBLICATIONS

European Patent Office, Extended Search Report re Application No. 19195321.5-1201, dated Jan. 31, 2020, 7 pages, Munich, Germany.

*Primary Examiner* — Tuan T Dinh
(74) *Attorney, Agent, or Firm* — McGarry Bair PC

(57) ABSTRACT

A DC link bus includes a first and second set of conductive layers, arranged between insulation layers that separate the first set from the second set. A set of positive and negative link conductors are coupled normal to a respective set of conductive layers, and coupled together to define a respective positive bus and a negative bus. Additionally, a method of forming a DC link bus includes respectively coupling a first and a second set of parallel conductive layers to each other. Coupling a set of positive link connectors, and a set of negative link connectors, perpendicular to the first set and second set of layers, respectively, and to each other to define a positive bus and a negative bus. Interdigitally arranging the first and second set of conductive layers, spacing adjacent layers of the second set of layers to reduce an inductance between the positive and negative bus.

18 Claims, 5 Drawing Sheets

(51) Int. Cl.
*H05K 3/46* (2006.01)
*H02M 5/44* (2006.01)

(52) U.S. Cl.
CPC .............. *H05K 2201/093* (2013.01); *H05K 2201/10015* (2013.01); *H05K 2201/10166* (2013.01); *H05K 2201/10174* (2013.01); *H05K 2201/10272* (2013.01); *H05K 2201/10522* (2013.01)

(58) Field of Classification Search
USPC .... 361/301.2, 301.4, 321.1, 321.2, 328–329, 361/766, 775–778, 783
See application file for complete search history.

(56) References Cited

U.S. PATENT DOCUMENTS

| | | | | |
|---|---|---|---|---|
| 5,365,424 A | * | 11/1994 | Deam | H01L 23/52 174/72 B |
| 5,912,809 A | * | 6/1999 | Steigerwald | H05K 1/0262 174/255 |
| 8,054,608 B2 | | 11/2011 | Yoon | |
| 8,947,899 B2 | * | 2/2015 | Savatski | H02M 5/4585 174/68.2 |
| 8,970,148 B2 | * | 3/2015 | Vrankovic | H02P 27/06 318/400.25 |
| 9,236,189 B2 | | 1/2016 | Oh | |
| 10,185,141 B2 | * | 1/2019 | Wang | G02B 26/001 |
| 2006/0002054 A1 | | 1/2006 | Anwar et al. | |
| 2013/0234636 A1 | | 9/2013 | Savatski et al. | |
| 2015/0035496 A1 | | 2/2015 | Kikuchi | |
| 2018/0049310 A1 | | 2/2018 | Schneider et al. | |
| 2018/0226315 A1 | * | 8/2018 | Gottwald | H01L 24/19 |

\* cited by examiner

DIRECT CURRENT LINK BUS FOR A POWER CONVERTER AND METHOD OF FORMING A DIRECT CURRENT LINK BUS

BACKGROUND

Electrical power systems, such as those found in an aircraft power distribution system, employ power generating systems or power sources, such as generators, for generating electricity for powering the systems and subsystems of the aircraft. As the electricity traverses electrical bus bars to deliver power from power sources to electrical loads, power distribution nodes dispersed throughout the power system ensure the power delivered to the electrical loads meets the designed power criteria for the loads. In one example, the power distribution system can include power converter modules. Power converter modules can, for instance, further provide voltage step-up or step-down power conversion, direct current (DC) to alternating current (AC) power conversion or AC to DC power conversion, or AC to AC power conversion involving changes in frequency or phase, or switching operations to selectively enable or disable the delivery of power to particular electrical loads, depending on, for example, available power distribution supply, criticality of electrical load functionality, or aircraft mode of operation, such as take-off, cruise, or ground operations.

BRIEF DESCRIPTION

In one aspect, the present disclosure relates to a direct current (DC) link bus including a conductive positive link connector extended in a first direction, a first set of parallel planar conductive layers extending normally from and spaced along the positive link connector, a conductive negative link connector extending parallel to the conductive positive link connector, a second set of parallel planar conductive layers extending normally from and spaced along the negative link connector, the first set and second sets of parallel planar conductive layers interdigitally arranged, and a set of insulation layers separating each of the first set of parallel planar conductive layers from the adjacent second set of parallel planar conductive layers by a length in the first direction. The length is configured to reduce an inductance between the conductive positive link connector and the conductive negative link connector.

In another aspect, the present disclosure relates to a power converter including a diode bridge having an input configured to connect with an alternating current (AC) power source and a direct current (DC) link output, a solid state commutation device configured to receive the DC link output and to switchably adapt the DC link output to a predetermined AC power output, and a DC link bus connecting the DC link output of the diode bridge with the solid state commutation device. The DC link bus further including a first set of parallel planar conductive layers electrically connected and defining a positive bus bar, a second set of parallel planar conductive layers electrically connected and defining a negative bus, and wherein the first set and second set of parallel planar conductive layers parallel to each other and interdigitally arranged, and a set of insulation layers separating each of the first set of parallel planar conductive layers from the adjacent second set of parallel planar conductive layers by a length. The length is configured to reduce an inductance between the DC link output.

In yet another aspect, the present disclosure relates to a method of forming a direct current (DC) link bus, including providing a first set of parallel planar conductive layers electrically connected and defining a positive bus bar, providing a second set of parallel planar conductive layers electrically connected and defining a negative bus bar, and interdigitally arranging the first set of conductive layers and the second set of conductive layers, wherein each layer of the first set of conductive layers is spaced from an adjacent layer of the second set of conductive layers by an insulation layer, and wherein the spacing of the insulation layer is selected to reduce an inductance between the positive bus bar and the negative bus bar.

DETAILED DESCRIPTION

Figure 1:
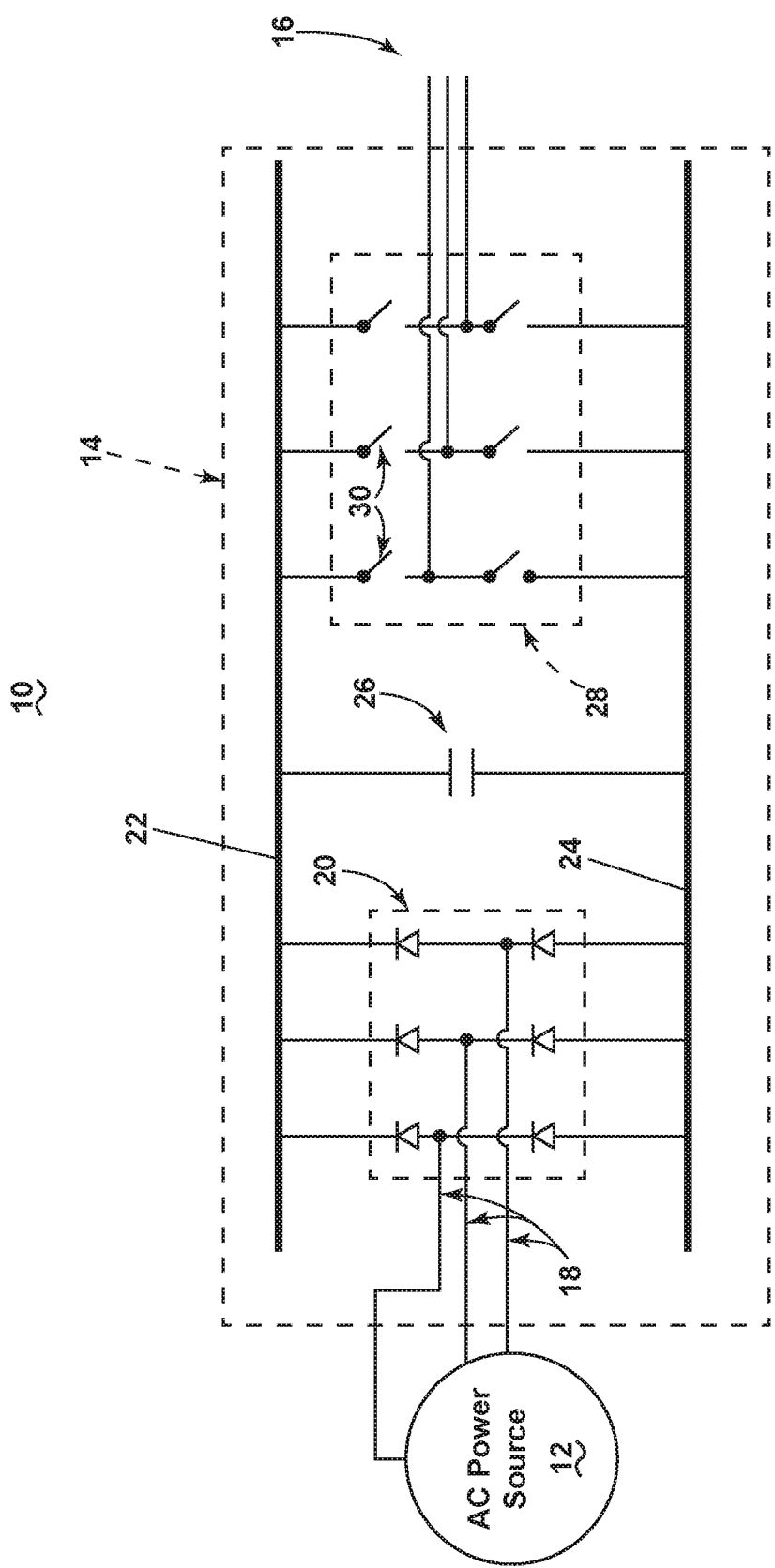
FIG. 1 illustrates an electrical schematic view of a power converter in accordance with various aspects described herein.

The described aspects of the present disclosure are directed to an electrical power distribution system or power converter device, module, node, or the like, which enables or facilitates distribution of electrical power, such as from a gas turbine engine driven generator, to at least one electrical load. It will be understood that while aspects of the disclosure are shown in or described with reference to an aircraft environment or power distribution system, the disclosure is not so limited and has general application to electrical power systems in non-aircraft applications, such as other mobile applications and non-mobile industrial, commercial, and residential applications.

While "a set of" various elements will be described, it will be understood that "a set" can include any number of the respective elements, including only one element. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus. In another non-limiting example, connections can include physical connectors or connection mechanisms, including but not limited to, joints, adhesive, welding, soldering, or mechanical connectors, such as screws, or the like.

All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein. The program can include a computer program product that can include machine-readable media for carrying or having machine-executable instructions or data structures stored thereon. Such machine-readable media can be any available media, which can be accessed by a general purpose or special purpose computer or other machine with a processor. Generally, such a computer program can include routines, programs, objects, components, data structures, algorithms, etc., that have the technical effect of performing particular tasks or implement particular abstract data types.

Aspects of the disclosure can be implemented in any electrical circuit environment having a switch. A non-limiting example of an electrical circuit environment that can include aspects of the disclosure can include an aircraft power system architecture, which enables production of electrical power from at least one spool of a turbine engine, preferably a gas turbine engine, and delivers the electrical power to a set of electrical loads via at least one solid state switch, such as a solid state power controller (SSPC) switching device. One non-limiting example of the SSPC can include a silicon carbide (SiC) or Gallium Nitride (GaN) based, high power switch. SiC or GaN can be selected based on their solid state material construction, their ability to handle high voltages and large power levels in smaller and lighter form factors, and their high speed switching ability to perform electrical operations very quickly. Additional switching devices or additional silicon-based power switches can be included. SSPCs can further include operational functionality including, but not limited to, current limiting, overcurrent protection, trip functions (i.e. opening the switchable element in response to a value out of expected range), or the like.

In another non-limiting example, a solid state power controller can be implemented as a component or subcomponent of a power converter unit, module, device, or the like. The power converter can be configured, adapted, selected, or the like, to convert a first power received from an upstream power source, such as a generator, to a second power ultimately provided to a set of electrical loads. In this sense, the first power and the converted second power can include different electrical characteristics, including, but not limited to, voltage levels, current amounts, power type (e.g. AC-to-AC, AC-to-DC, DC-to-AC, DC-to-DC, etc.), frequency, or a combination thereof. Additionally, while terms such as "voltage", "current", and "power" can be used herein, it will be evident to one skilled in the art that these terms can be interrelated when describing aspects of the electrical circuit, or circuit operations.

The exemplary drawings are for purposes of illustration only and the dimensions, positions, order and relative sizes reflected in the drawings attached hereto can vary.

FIG. 1 illustrates a portion of a power distribution system 10, in accordance with aspects described herein. The power distribution system 10 can include a power source configured to generate source of electrical energy, shown as an AC power source 12, and a power converter, such as a DC link bus 14 configured for converting a first power received from the AC power source 12 to a second power output 16. The second power output 16 can further be provided to a set of electrical loads of the power distribution system 10.

The DC link bus 14 is shown connected with a rectifier, such as a diode bridge 20, that receives power supplied by the upstream connected AC power source 12 by way of a set of power inputs 18. In the non-limiting example illustrated, the AC power source 12 can be configured to supply three phase power to the set of power inputs 18. In this sense, the diode bridge 20 can also be configured to rectify the AC power received at the set of power inputs 18 to a DC power supplied to the DC link bus 14. The DC link bus can further include a set of power bus bars or transmission conductors, shown as a first or positive bus bar 22 and a second or negative bus bar 24. The positive and negative bus bars 22, 24 can receive the rectified DC power from the diode bridge 20.

The DC link bus 14 is also shown connected with an inverter, such as an active inverter or commutation device 28. As used herein, the commutation device 28 can be an "active" device in that it uses, utilizes, or is otherwise enabled by way of an active control schema to perform commutation activities. For instance, the commutation device 28 is shown including a set of switching elements 30 that can be controllably operated by way of a switch controller module (not shown) to selectively enable switching operations configured to commutate the DC power received by the positive and negative bus bars 22, 24 or the DC link bus 14 to an AC power output of the second power output 16. In this sense, the commutation device 28 or switching elements 30 switchably adapt the DC power received by the positive and negative bus bars 22, 24 to a different power output, including but not limited to a predetermined AC power output.

In one non-limiting example, the commutation device 28 can include a set of solid state switches, power controllers, or the like, such as silicon carbide (SiC) or Gallium Nitride (GaN) based switching commutating devices. In another non-limiting example, the commutation device 28 can be configured to invert the DC power received by the DC link bus 14 to a three phase AC power output 16 at 400 Hertz.

Non-limiting aspects of the disclosure can optionally include a capacitive element, shown as a capacitor 26, for example, to increase the capacitance of the DC link bus 14, or to increase the capacitance between the positive and negative bus bars 22, 24.

Figure 2:
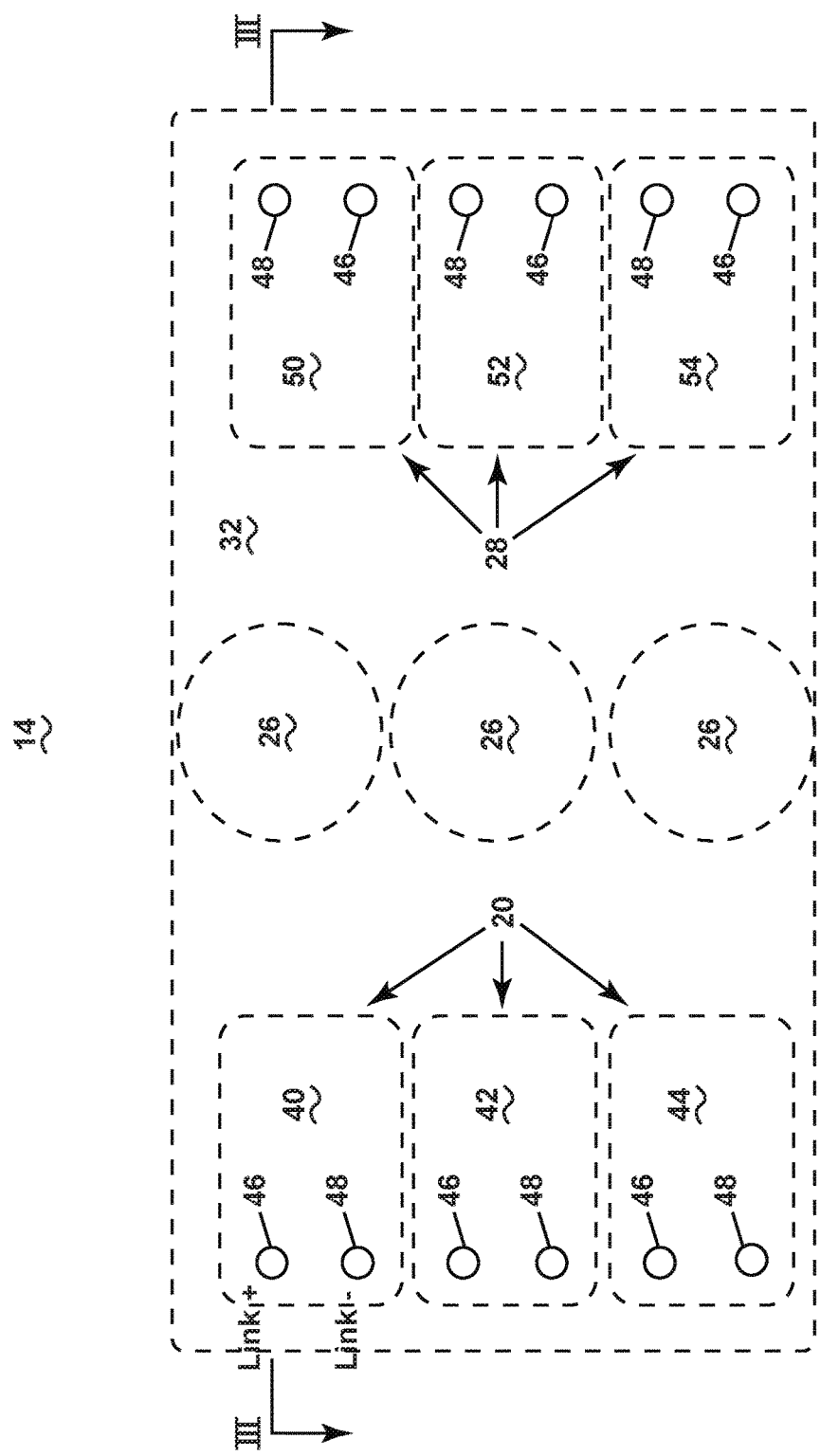
FIG. 2 illustrates a top-down schematic view of a DC link bus of the power converter of FIG. 1, in accordance with various aspects described herein.

FIG. 2 illustrates a top-town schematic view of one non-limiting example of the DC link bus 14. As shown, the DC link bus 14 can include a non-conductive top surface 32 overlying a set of rectifying elements, such as diodes 20 or diode bridge components, shown as a first diode set 40, a second diode set 42, and a third diode set 44. While three diode sets 40, 42, 44 are shown in the illustrated example, any number of diode sets or rectifying elements 20 can be included in aspects of the disclosure. Each diode set 40, 42, 44 can further be connected with the DC link bus 14 by way of a respective positive link connector 46 (or subset thereof) and a respective negative link connector 48 (or subset thereof).

The DC link bus 14 is also shown overlying a set of commutation devices 28, shown as a first commutation device 50, a second commutation device 52, and a third commutation device 54. While three commutation devices 50, 52, 54 are shown in the illustrated example, any number of commutation devices 28 can be included in aspects of the disclosure. For example, three commutation devices 50, 52, 54 can be configured to invert the DC power received by the DC link bus 14 to the three phase AC power output 16 of FIG. 1. Each commutation devices 50, 52, 54 can further be connected with the DC link bus 14 by way of a respective positive link connector 46 (or subset thereof) and a respective negative link connector 48 (or subset thereof). The illustration also shows the DC link bus 14 overlying an optional set of three capacitive devices, or capacitors 26.

While not illustrated, it is understood the set of positive link connectors 46 are all electrically connected to each other to form or define the positive bus bar 22 of schematic FIG. 1. Similarly, while not illustrated, it is understood the set of negative link connectors 48 are all electrically connected to each other to form or define the negative bus bar 24 of schematic FIG. 1.

Figure 3:
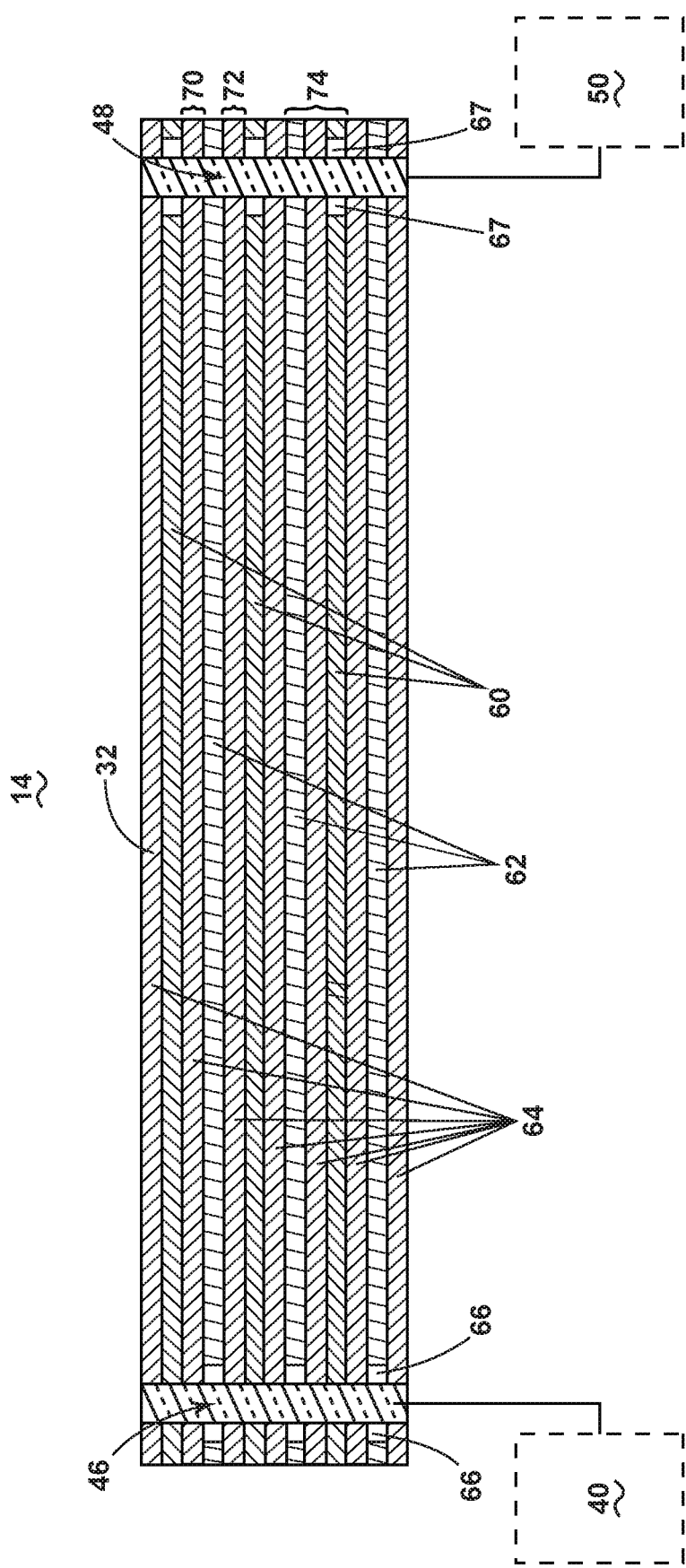
FIG. 3 illustrates a schematic cross-sectional view of the DC link bus, taken along line of FIG. 2, in accordance with various aspects described herein.

FIG. 3 illustrates a schematic cross-sectional view of the DC link bus 14, taken along line of FIG. 2. As shown, each of the set of positive link connectors 46 and each of the set of negative link connectors 48 extend in parallel in a first horizontal direction (with reference to the illustration) away from the non-conductive surface 32 of the DC link bus 14. Extending laterally from the positive link connector 46 is a first set of parallel planar conductive layers 60 and spaced apart from each other along the horizontal length of the positive link connector 46. It is understood that each of the first set of parallel conductive layers 60 can extend perpendicularly or normally away from the positive link connector 46 such that each of the first set of conductive layers 60 are parallel to each other layer 60. The positive link connector 46 is further shown schematically connected with, for example, the first diode set 40, though an exposed conductor pad where connector 46 and diode set 40 attach to each other. Collectively, the positive link connector 46 electrically connected with each of the first set of parallel conductive layers 60 forms or defines the positive bus bar 22 of the schematic view of FIG. 1.

Additionally, extending laterally from the negative link connector 48 is a second set of parallel planar conductive layers 62 and spaced apart from each other along the horizontal length of the negative link connector 48. It is understood that each of the second set of parallel conductive layers 62 can extend perpendicularly or normally away from the negative link connector 48 such that each of the second set of conductive layers 62 are parallel to each other layer 62. The negative link connector 48 is further shown schematically connected with, for example, the first commutation device 50. Collectively, the negative link connector 48 electrically connected with each of the second set of parallel conductive layers 62 forms or defines the negative bus bar 24 of the schematic view of FIG. 1.

In one non-limiting example, the first and second sets of parallel conductive layers 60, 62 can comprise copper material, can be parallel to each other, and interdigitally arranged, that is, alternating between positive layer 60 and negative layer 62 along the horizontal direction. Additionally, each respective positive layer 60 and negative layer 62 is spaced from one another by way of a non-conductive layer 64, including but not limited to, an insulating layer, a dielectric layer, a printed circuit board layer, or the like. Furthermore, the first set of conductive layers 60 can extend proximate to, but not electrically connected with, the negative link connector 48.

In the illustrated example, the first set of conductive layers 60 are spaced from the negative link connector 48 by a respective first set of gaps 67 or non-conductive cavities. Similarly, the second set of conductive layers 62 can extend proximate to, but not electrically connected with, the positive link connector 46. In the illustrated example, the second set of conductive layers 62 are spaced from the positive link connector 46 by a respective second set of gaps 66 or non-conductive cavities. While first and second sets of gaps 66, 67 are illustrated, the respective layers 60, 62 can be non-conductively spaced from opposing conductive links 46, 48 by way of air gaps, or another non-conductive material, including but not limited to an insulating material, a dielectric material, a printed circuit board material, or the like.

As shown, a first length 70 of a non-conductive layer 64 can horizontally space a respective first conductive layer 60 overlying a respectively adjacent second conductive layer 62. Also shown, a second length 72 of another non-conductive layer 64 can horizontally space a respective second conductive layer 62 overlying a respectively adjacent first conductive layer 60. In non-limiting examples, the first length 70 can measure 8 millimeters and the second length 72 can measure 8 millimeters. In another non-limiting example, the first length 70 can be different from the second length 72. In another non-limiting example, each respective first or second conductive layer 60, 62 can measure 2.7 millimeters in the horizontal direction. Thus, in one example, a third length 74 of a complete "sandwich" layering including a first conductive layer 60, a non-conductive layer 64, and a second conductive layer 62 can measure 13.4 millimeters.

While each of the first and second sets of parallel conductive layers 60, 62 are shown to include three conductive layers 60, 62, respectively, either or both the first and second sets of parallel conductive layers 60, 62 can include any number of respectively similar or dissimilar conductive layers 60, 62. Additionally, while the illustrations of FIGS. 2 and 3 demonstrate one non-limiting example of rectangular layer constructions, any geometric shape of similarly constructed layer compositions, as described herein, can be included. For instance, aspects of the DC link bus 14 can include a triangular, circular, trapezoidal, or the like, construction, when viewed from the top-down perspective of FIG. 2. Thus, non-limiting aspects of the DC link bus 14 can include multi-layered printed circuit boards, or other similar layered constructions.

In one non-limiting example, the configuration of the DC link bus 14, the first and second sets of parallel conductive layers 60, 62, of the set of non-conductive layers can be configured to reduce an inductance between the respective conductive layers 60, 62, positive and negative bus bars 22, 24, or positive and negative link connectors 46, 48. Furthermore, the configuration of the DC link bus 14, the first and second sets of parallel conductive layers 60, 62, of the set of non-conductive layers can be configured to increase a capacitance, such as a parasitic capacitance, between the respective conductive layers 60, 62, positive and negative bus bars 22, 24, or positive and negative link connectors 46, 48. In non-limiting examples, the reducing the inductance, or the increasing the capacitance, can be enabled, accomplished, or otherwise configured by way of selecting the first, second or third lengths 70, 72, 74 of the non-conductive layers, or sandwich compositions.

In another non-limiting example aspect of the disclosure, the reducing the inductance between the respective conductive layers 60, 62, positive and negative bus bars 22, 24, or positive and negative link connectors 46, 48 can effectively increase the switching speed capabilities of the solid state commutation device(s) 28, 50, 52, 54 downstream of the DC link bus 14. In conventions DC link buses, complex geometric configurations, including non-planar configurations are utilized to reduce the inductance between positive and negative link terminals to increase current density and utilize higher switching speeds of commutation devices. In contrast, aspects of the present disclosure are enabled to utilize alternating positive and negative planar layers 60, 62 to ensure high current densities at each positive and negative bus bar 22, 24 or each positive and negative link connectors 46, 48, while reducing the inductance and increasing the capacitance between them. Thus, the switching speed of the commutation device(s) 28, 50, 52, 54 are not limited, or less likely to be limited by the inductance between the positive and negative bus bar 22, 24 or each positive and negative link connectors 46, 48. In one non-limiting example, aspects of the disclosure can be utilized to enable switching speeds of solid state commutation device(s) 28, 50, 52, 54 greater than 200 KHZ due to a decreased inductance on connectors 46 and 48. A conventional DC link bus bar inductance among these connectors has been observed to be approximately 11 nH and can be decreased to below 7 nH with aspects of the disclosure.

Figure 4:
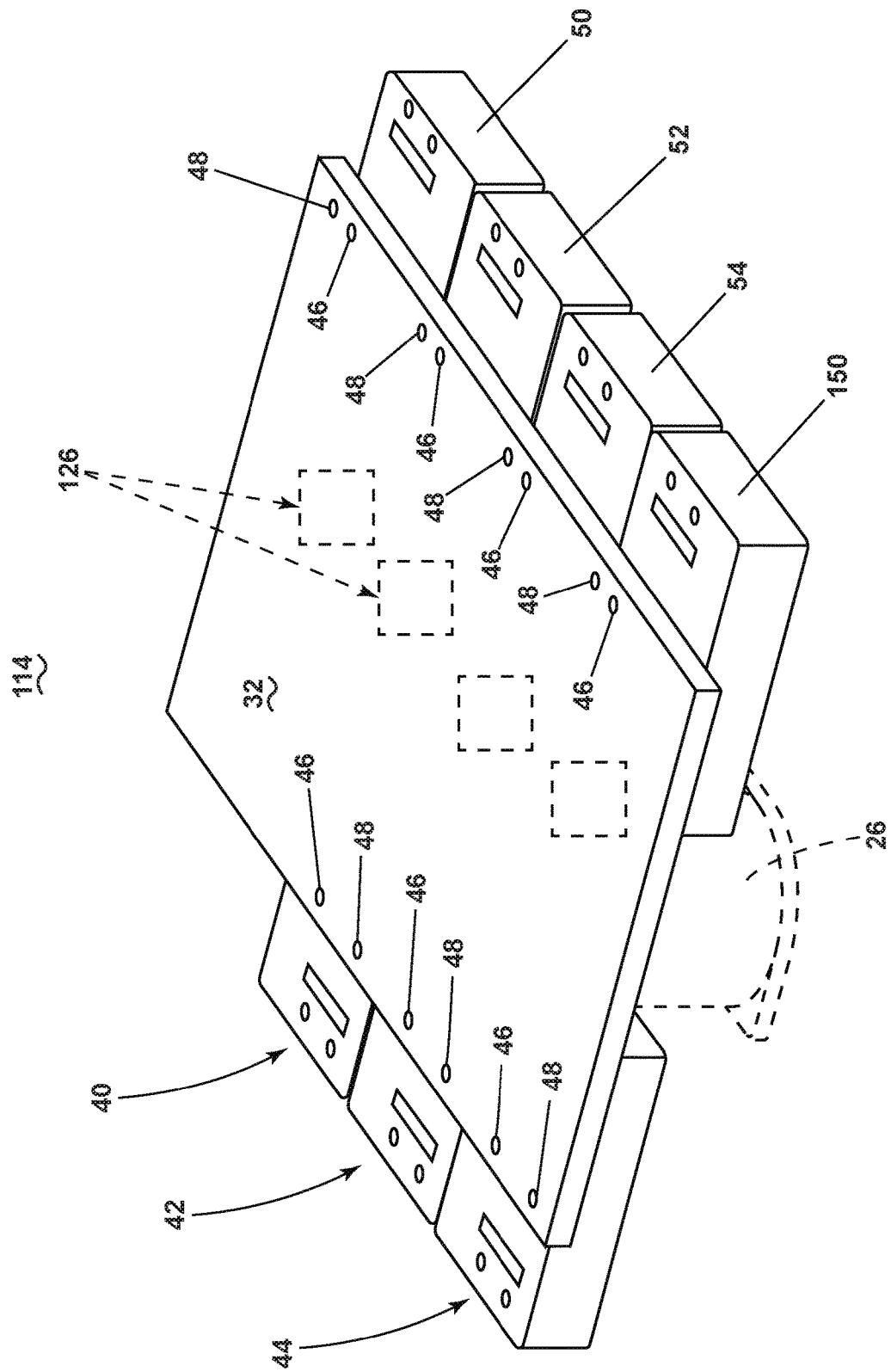
FIG. 4 illustrates an isometric view of a DC link bus, in accordance with various aspects described herein.

FIG. 4 illustrates an isometric view of another DC link bus 114. The DC link bus 114 is similar to the DC link bus 14; therefore, like parts will be identified with like numerals increased by 100, with it being understood that the description of the like parts of the DC link bus 14 applies to the DC link bus 114, unless otherwise noted. As shown, non-limiting aspects of the disclosure can be included wherein at least a subset of the diode set 40, 42, 44 can be mounted or connected below or beneath the DC link bus 114. Similarly, as shown, non-limiting aspects of the disclosure can be included wherein at least a subset of the commutation devices 50, 52, 54 can be mounted or connected below or beneath the DC link bus 114. Another difference is that the DC link bus 114 is configured to receive a fourth commutation device 150, for example, to provide a four phase power output.

As shown, one or more optional capacitors 26 can further be connected below or beneath the DC link bus 114. Alternatively or additionally, one or more optional capacitors 126 can be surface mounted above or on top of the non-conductive surface 32 of the Dc link bus 114. In yet another non-limiting example, upon a sufficiently increased selected or predetermined parasitic capacitance between the layers of the DC link bus 14, 114, the stand-alone optional capacitors 26, 126 or capacitive devices can be eliminated.

Figure 5:
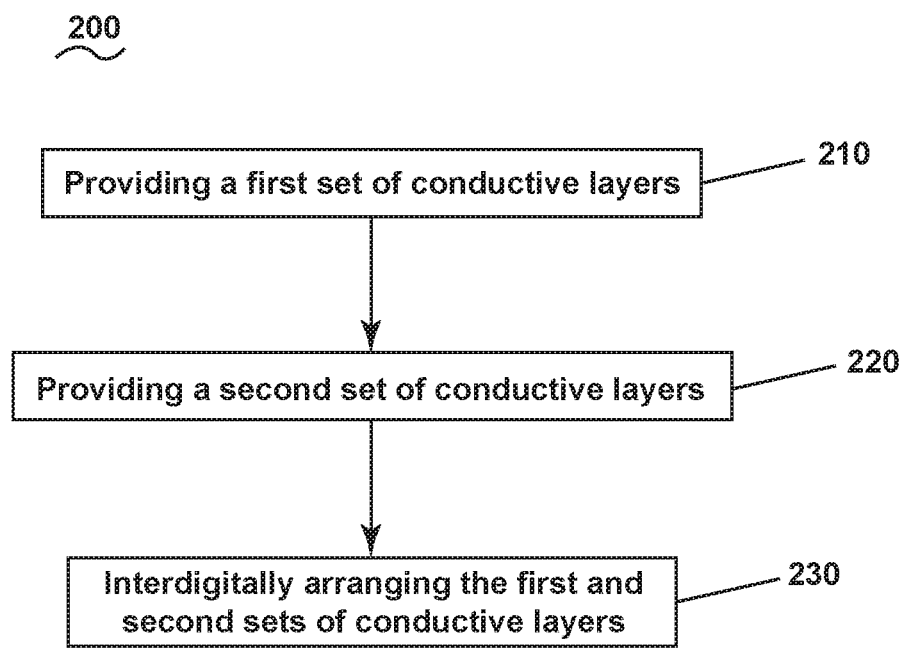
FIG. 5 is an example a flow chart demonstrating a method of forming a DC link bus in accordance with various aspects described herein.

FIG. 5 illustrates a flow chart demonstrating a method 200 of forming a direct current (DC) link bus 14, 114. The method 200 begins by providing a first set of parallel planar conductive layers 60 electrically connected and defining a positive bus bar 22, at 210. Next, the method 200 continues by providing a second set of parallel planar conductive layers 62 electrically connected and defining a negative bus bar 24, at 220. Finally, the method 200 includes interdigitally arranging the first set of conductive layers 60 and the second set of conductive layers 62, wherein each layer 60 of the first set of conductive layers 60 is spaced from an adjacent layer 62 of the second set of conductive layers 62 by an insulation layer 64, and wherein the spacing 70, 72, 74 of the insulation layer 64 is selected to reduce an inductance between the positive bus bar 22 and the negative bus bar 24, at 230.

The sequence depicted is for illustrative purposes only and is not meant to limit the method 200 in any way as it is understood that the portions of the method can proceed in a different logical order, additional or intervening portions can be included, or described portions of the method can be divided into multiple portions, or described portions of the method can be omitted without detracting from the described method. For example, the method 200 can further include selecting the spacing 70, 72, 74 of the insulation layer 64 such that a solid state commutation speed of a solid state commutator 28, 50, 52, 54, 150 electrically connected with the positive and negative bus bars 22, 24 is not limited due to the inductance between the positive and negative bus bars 22, 24. In another example, the method 200 can further include selecting the spacing 70, 72, 74 of the insulation layer 64 such that a parasitic capacitance between adjacent layers 60, 62 of the first and second sets of conductive layers 62, 64 is increased sufficiently to eliminate stand-alone capacitors 26, 126, as described.

Many other possible aspects and configurations in addition to that shown in the above figures are contemplated by the present disclosure. Additionally, the design and placement of the various components can be rearranged such that a number of different in-line configurations could be realized.

The aspects disclosed herein provide a DC link bus for a power connector and method of forming the same. Conventional DC link buses lower the electrical inductance on the switching elements of power inverters by making use of non-coplanar shapes that increases the positive and negative plane overlap area and therefore increasing capacitance of the buses. Aspects of the disclosure develops a DC Link bus which is not made of copper bars but instead is made of a multilayered composition that is able to increase the capacitance in the positive and negative connectors and therefore lower the inductance to enable a faster commutation speed offered by solid state commutation devices.

In one non-limiting advantage, aspects of the disclosure reduce the production cost of manufacturing bus bars with a complex shapes for increasing the capacitance between commutation terminals, by instead utilizing layered planar compositions. Another non-limiting advantage can include enabling a competitively smaller envelope product offering since stacked capacitors can be eliminated. Furthermore, by utilizing solid state commutation devices, a higher power conversion efficiency can be offered, since it enables a faster commutation speed.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A direct current (DC) link bus, comprising:
A set of conductive positive link connector extended in a first direction, each of the positive link conductors being electrically coupled together to define a positive bus;
a first set of parallel planar conductive layers coupled to and extending normally from and spaced along the set of positive link connectors;
a set of conductive negative link connectors extending parallel to the set of conductive positive link connectors, each of the negative link conductors being electrically coupled together to define a negative bus;
a second set of parallel planar conductive layers coupled to and extending normally from and spaced along the set of negative link connectors, the first set and second sets of parallel planar conductive layers interdigitally arranged; and
a set of insulation layers separating each of the first set of parallel planar conductive layers from the adjacent second set of parallel planar conductive layers by a length in the first direction;
wherein the length is configured to reduce an inductance between the set of conductive positive link connectors and the set of conductive negative link connectors.

2. The DC link bus of claim 1 wherein the length is further configured to increase a parasitic capacitance between the set of conductive positive link connectors and the set of conductive negative link connectors.

3. The DC link bus of claim 1 wherein the length is further configured to reduce an inductance between adjacent layers of the first and second sets of parallel planar conductive layers.

4. The DC link bus of claim 1 wherein the length is further configured to increase a parasitic capacitance between adjacent layers of the first and second sets of parallel planar conductive layers.

5. The DC link bus of claim 1 wherein the length is configured to reduce an inductance between the conductive positive link connectors and the conductive negative link connectors such that a switching speed of a solid state commutation device connected with the conductive positive link connectors and the conductive negative link connectors is not limited by the inductance between the conductive positive link connectors and the conductive negative link connectors.

6. The DC link bus of claim 5 wherein the switching speed of the commutation device is at least 200 KiloHertz.

7. A power converter, comprising:
a diode bridge having an input configured to connect with an alternating current (AC) power source and a direct current (DC) link output;
a solid state commutation device configured to receive the DC link output and to switchably adapt the DC link output to a predetermined AC power output; and
a DC link bus connecting the DC link output of the diode bridge with the solid state commutation device, and further comprising:
a first set of parallel planar conductive layers; a first set of conductive positive link connectors extending perpendicular to the planar conductive layers and coupled thereto, each of the positive link conductors being electrically coupled together to define a positive bus bar;
a second set of parallel planar conductive layers; a first set of conductive positive link connectors extending perpendicular to the planar conductive layers and coupled thereto, each of the positive link conductors being electrically coupled together to define a negative bus, wherein the first set and second set of parallel planar conductive layers are parallel to each other and interdigitally arranged; and
a set of insulation layers separating each of the first set of parallel planar conductive layers from the adjacent second set of parallel planar conductive layers by a length;
wherein the length is configured to reduce an inductance between the DC link output.

8. The power converter of claim 7 wherein the length is further configured to increase a parasitic capacitance between adjacent layers of the first and second sets of parallel planar conductive layers.

9. The power converter of claim 7 wherein the DC link bus is a multi-layered printed circuit board.

10. The power converter of claim 7 wherein the length is configured to reduce an inductance between the positive bus bar and the negative bus bar such that the solid state commutation device is not limited by the inductance between the positive bus bar and the negative bus bar.

11. The power converter of claim 7 wherein the solid state commutation device is at least one of a silicon carbide commutation device or a gallium nitride commutation device.

12. The power converter of claim 7 wherein predetermined AC power output is a three phase at 400 Hertz.

13. The power converter of claim 7 wherein the DC link output of the diode bridge is connected with a first subset of the positive and negative link connectors, and wherein the solid state commutation device is connected with a second subset of the positive and negative link connectors.

14. The power converter of claim 8 wherein parasitic capacitance is increased sufficiently to eliminate stand-alone capacitors for the power converter.

15. The power converter of claim 9 further comprising a set of capacitors connected between the positive bus bar and the negative bus bar, wherein the set of capacitors are surface-mounted to the printed circuit board.

16. A method of forming a direct current (DC) link bus, comprising:
coupling a first set of parallel planar conductive layers to each other;
coupling a set of conductive positive link connectors perpendicular to the first set of parallel conductive layers;
coupling each of the positive link conductors together to define a positive bus bar;
coupling a second set of parallel planar conductive layers to each other;
coupling a set of conductive negative link connectors perpendicular to the second set of parallel planar conductive layers;
coupling each of the negative link conductors together to define a negative bus bar;
and
interdigitally arranging the first set of conductive layers and the second set of conductive layers, wherein each layer of the first set of conductive layers is spaced from an adjacent layer of the second set of conductive layers by an insulation layer, and wherein the spacing of the insulation layer is selected to reduce an inductance between the positive bus bar and the negative bus bar.

17. The method of claim 16, further comprising selecting the spacing of the insulation layer such that a solid state commutation speed of a solid state commutator electrically connected with the positive and negative bus bars is not limited due to the inductance between the positive and negative bus bars.

18. The method of claim 16 further comprising selecting the spacing of the insulation layer such that a parasitic capacitance between adjacent layers of the first and second sets of conductive layers is increased sufficiently to eliminate stand-alone capacitors.

* * * * *